(12) United States Patent
Pal

(10) Patent No.: US 9,832,910 B2
(45) Date of Patent: Nov. 28, 2017

(54) RAM AIR FAN AND POWER ELECTRONICS COOLING SYSTEMS

(71) Applicant: HAMILTON SUNSTRAND CORPORATION, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 609 days.

(21) Appl. No.: 14/457,242

(22) Filed: Aug. 12, 2014

(65) Prior Publication Data

US 2016/0050791 A1 Feb. 18, 2016

(51) Int. Cl.
*H05K 7/20* (2006.01)
*B64D 41/00* (2006.01)
*B64D 13/06* (2006.01)

(52) U.S. Cl.
CPC ....... *H05K 7/20281* (2013.01); *B64D 41/007* (2013.01); *H05K 7/20136* (2013.01); *H05K 7/20272* (2013.01); *H05K 7/20918* (2013.01); *H05K 7/20927* (2013.01); *B64D 2013/0614* (2013.01); *B64D 2013/0618* (2013.01); *B64D 2013/0674* (2013.01); *Y02T 50/56* (2013.01)

(58) Field of Classification Search
CPC .... B64D 2013/0614; B64D 2013/0618; B64D 2013/0611; B64D 2013/0603; B64D 41/007; H05K 7/20281; H05K 7/20136; H05K 7/20272; H05K 7/20918; H05K 7/20927; Y02T 50/56
See application file for complete search history.

(56) References Cited

U.S. PATENT DOCUMENTS

| | | | | |
|---|---|---|---|---|
| 4,503,666 A * | 3/1985 | Christoff | ........... | B64D 13/06 60/39.183 |
| 5,484,120 A | 1/1996 | Blakeley et al. | | |
| 5,490,645 A * | 2/1996 | Woodhouse | ........... | B64D 13/06 244/118.5 |
| 6,082,626 A * | 7/2000 | Morikawa | ........... | B60H 1/02 237/12.3 B |
| 7,024,874 B2 * | 4/2006 | Zywiak | ........... | B64D 11/04 62/199 |
| 8,997,847 B2 * | 4/2015 | Schwartz | ........... | F01P 7/042 165/244 |

(Continued)

FOREIGN PATENT DOCUMENTS

| | | |
|---|---|---|
| GB | 767637 | 2/1957 |
| WO | 02098736 | 12/2002 |

OTHER PUBLICATIONS

Extended European Search Report dated Dec. 11, 2015 in European Application No. 15180471.3.

*Primary Examiner* — Tho V Duong
(74) *Attorney, Agent, or Firm* — Snell & Wilmer, L.L.P.

(57) ABSTRACT

A power electronics cooling system includes a ram air fan with one or more blades and a ram air fan motor connected via an output shaft. The ram air fan draws in air and passes it across a heat exchanger to cool one or more cooling liquids. One or more pumps pressurize and pump the cooling liquids to various electronic components, including one or more motor controllers. The pumps may be mechanically or electrically coupled to the output shaft of the ram air fan, such that the motor of the ram air fan provides energy to the pumps.

5 Claims, 4 Drawing Sheets

(56) References Cited

U.S. PATENT DOCUMENTS

| | | | |
|---|---|---|---|
| 2004/0250992 A1* | 12/2004 | Aoki | H05K 7/20727 165/80.3 |
| 2007/0044451 A1* | 3/2007 | Jones | F28D 15/02 60/226.1 |
| 2013/0048780 A1 | 2/2013 | Masoudipour et al. | |
| 2014/0037423 A1 | 2/2014 | Weber et al. | |
| 2014/0146469 A1* | 5/2014 | Frey | B64D 13/06 361/690 |

* cited by examiner

RAM AIR FAN AND POWER ELECTRONICS COOLING SYSTEMS

FIELD

The present disclosure relates generally to power electronics cooling systems in aircraft and more specifically, to the use of ram air fans to power such cooling systems.

BACKGROUND

Conventionally, various types of aircraft utilize ram air flow for cooling various components of the aircraft, such as lubrication and/or electrical components. Air drawn from the outside environment by a ram air fan may be passed across a heat exchanger to provide cooling to various cooling liquids. Typically, pumps are used to circulate cooling liquid and deliver it to components that would benefit from cooling. These pumps may be located at positions remote from the ram air fan, including, for example, in one or more wheel wells.

SUMMARY

A power electronics cooling system in accordance with the present disclosure may comprise a ram air fan comprising an air inlet and a blade mechanically coupled to an output shaft, a first pump motor coupled to a first cooling pump, wherein the first pump motor is mechanically coupled to the output shaft of the ram air fan, wherein the first cooling pump pumps a first cooling liquid through a heat exchanger, and wherein the blade forces air through the heat exchanger. The first cooling liquid may be pumped through the heat exchanger and to a first electronics package. The first electronics package may comprise a first ram fan motor controller. Further, a second electronics package may comprise a second motor controller. A second motor may be coupled to a second cooling pump, wherein the second cooling pump pumps a second cooling liquid through the heat exchanger and to the second electronics package. The ram air fan and first pump motor may be located on an aircraft, wherein the first pump motor comprises a first shaft and first gear configured to engage with and transfer rotation from an output gear of the output shaft, and the output shaft of the ram air fan provides rotation to the first pump motor while the aircraft is in flight. The first pump motor may comprise a first clutch configured to prevent the first pump motor from rotating faster than a predetermined speed. The first motor controller may provide electrical energy to the ram air fan while the aircraft is on the ground.

Another power electronics cooling system in accordance with the present disclosure may include a ram air fan comprising an air inlet and a blade mechanically coupled to a motor, a first pump motor coupled to a first cooling pump, wherein the first pump motor is electrically coupled to the motor of the ram air fan, wherein the first cooling pump pumps a first cooling liquid through a heat exchanger, and wherein the blade forces air through the heat exchanger. The first cooling liquid may be pumped through the heat exchanger and to a first electronics package. The first electronics package may comprise a first ram fan motor controller. Further, a second electronics package may comprise a second motor controller. A second motor may be coupled to a second cooling pump, wherein the second cooling pump pumps a second cooling liquid through the heat exchanger and to the second electronics package. The ram air fan and first pump motor may be located on an aircraft and the motor of the ram air fan provides electrical energy to the first pump motor while the aircraft is in flight. The first motor controller may provide electrical energy to the ram air fan while the aircraft is on the ground.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical and mechanical changes may be made without departing from the spirit and scope of the inventions. Thus, the detailed description herein is presented for purposes of illustration only and not for limitation. For example, any reference to singular includes plural embodiments, and any reference to more than one component or step may include a singular embodiment or step. Also, any reference to attached, fixed, connected or the like may include permanent, removable, temporary, partial, full and/or any other possible attachment option.

As used herein, "aft" refers to the direction associated with the tail of an aircraft, or generally, to the direction of exhaust of the gas turbine. As used herein, "fore" refers to the direction associated with the nose of an aircraft, or generally, to the direction of flight or motion.

Power electronics cooling systems in accordance with the present disclosure may comprise a ram air fan capable of providing cooling air to a heat exchanger. One or more cooling liquids may be pumped through the heat exchanger to provide cooling to one or more electronics components. For example, a first and/or second motor controller may be cooled by such cooling liquids.

Figure 1:
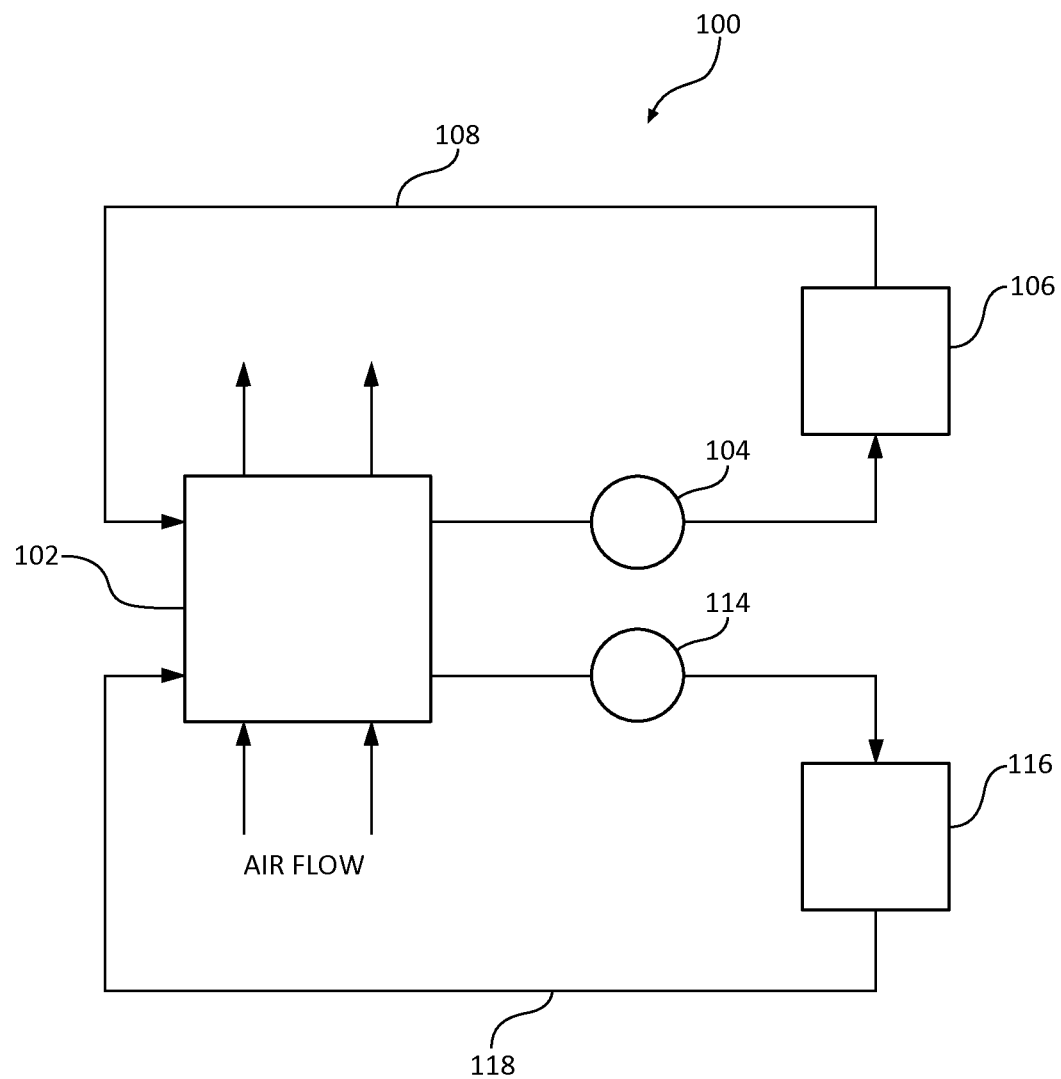
FIG. 1 illustrates, in accordance with various embodiments, a schematic of a power electronics cooling system.

Accordingly, with reference to FIG. 1, a schematic view of a cooling system 100 is illustrated. In various embodiments, cooling system 100 comprises a ram air fan 102. In various embodiments, ram air fan 102 draws in air from outside of the aircraft and passes it across a heat exchanger 112 to provide cooling to components of an aircraft, such as various electronic components.

In various embodiments, cooling system 100 further comprises a first cooling pump 104. For example, first cooling pump 104 is configured to pump a first cooling liquid 108 to other components of the cooling system. In various embodiments, first cooling pump 104 pumps first cooling liquid 108 to a first electronics package 106. For example, first cooling liquid 108 may cool a first electronics package 106 during operation of the aircraft to avoid over heating and damage occurring to components of first electronics package 106.

Cooling system 100 may further comprise, for example, a second cooling pump 114 configured to pump a second cooling liquid 118 to other components of the cooling system. For example, second cooling pump 114 may cool a second electronics package 116 during operation of the aircraft to prevent over heating and damage occurring to components of second electronics package 116.

In various embodiments, heat exchanger 112 may comprise, for example, a cross-flow type exchanger configured to use air from the environment to cool one or more liquid streams. For example, in various embodiments, first cooling liquid 108 is passed through and cooled by heat exchanger 112. In such embodiments, air drawn from the outside environment by ram air fan 102 may be pumped across heat exchanger 112, providing cooling to first cooling liquid 108.

Figure 2:
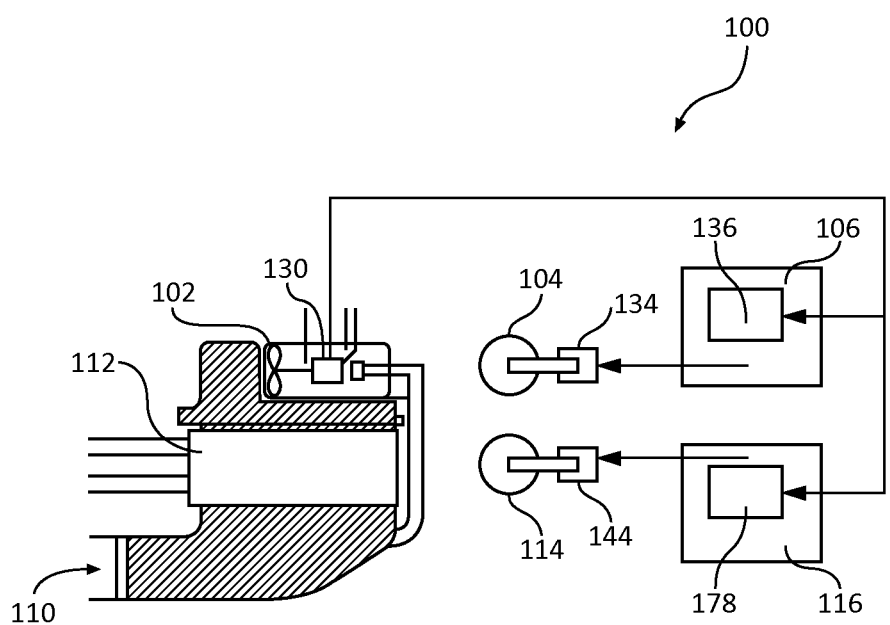
FIG. 2 illustrates, in accordance with various embodiments, a schematic of a ram air fan and power electronics cooling system.

With reference to FIG. 2, ram air fan 102 may be electrically coupled to first electronics package 106. For example, first electronics package may comprise a first motor controller 136. In various embodiments, first motor controller 136 may be capable of providing electrical power to and controlling an electric motor. First electronics package 106 may further comprise multiple motor controllers, including controllers configured to perform cabin air compression, provide main and auxiliary engine starts, control hydraulic pump motors, control fuel pump motors, and other functions. Any number and type of motor controller is within the scope of the present disclosure.

In various embodiments, ram air fan 102 comprises a ram air fan motor 130. For example, ram air fan motor 130 may comprise a three-phase electrical motor. When the aircraft is on the ground (such as taxiing, for example), three-phase AC electrical energy may be supplied to ram air fan motor 130 by, for example, first motor controller 136, causing air to be drawn in through air inlet 110. When the aircraft is in flight, ram air fan motor 130 may be rotated by airflow through windmilling, generating electrical energy. In various embodiments, electrical energy generated by ram air fan motor 130 may be used to power components of cooling system 100.

Cooling system 100 may also comprise, for example, a first pump motor 134. In various embodiments, first pump motor 134 may be coupled to first cooling pump 104 such that rotation of first pump motor 134 causes first cooling pump 104 to pressurize and pump first cooling liquid 108. Similarly, cooling system 100 may further comprise a second pump motor 144.

Figure 3:
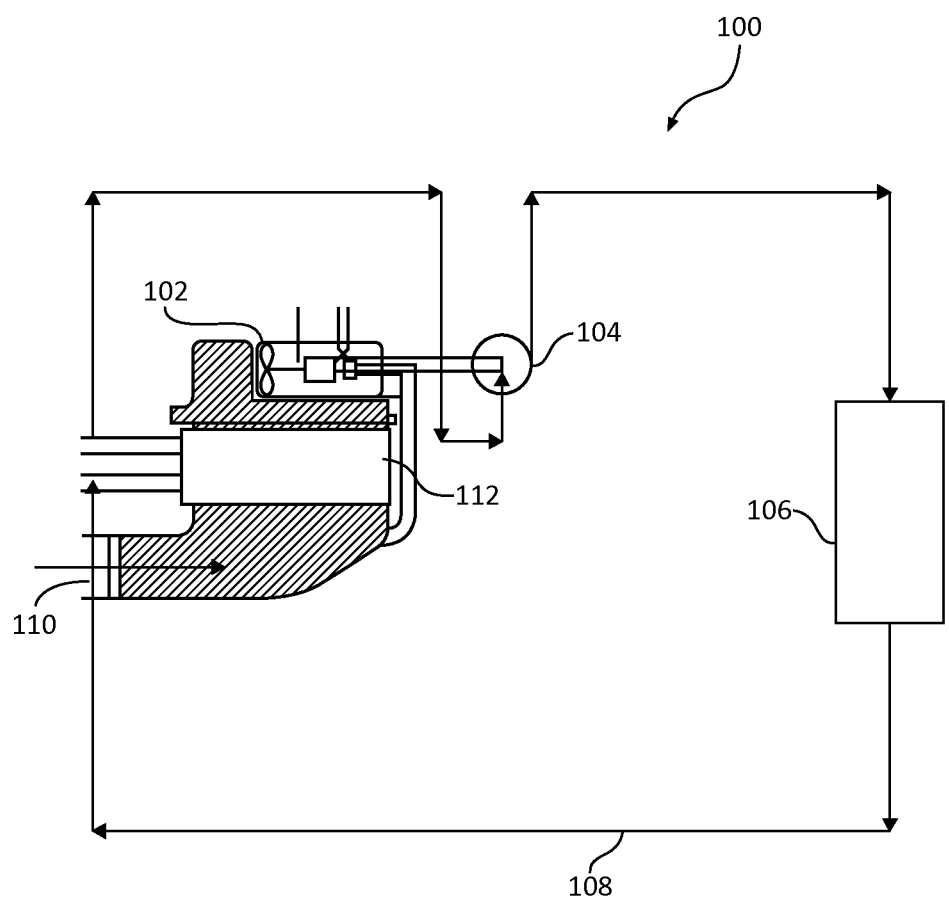
FIG. 3 illustrates, in accordance with various embodiments, a schematic of a further ram air fan and power electronics cooling system.

With reference to FIG. 3, ram air fan 102 may, for example, be mechanically coupled to first cooling pump 104. In such embodiments, while the aircraft is in flight, ram air fan 102 may be rotated by airflow, often referred to as "windmilling," which in turn may cause first cooling pump 104 to pressurize and pump first cooling liquid 108. In various embodiments, when the aircraft is not in flight, power may be applied to an electric motor within ram air fan 102, which in turn causes first cooling pump 104 to pressurize and pump first cooling liquid 108.

Figure 4:
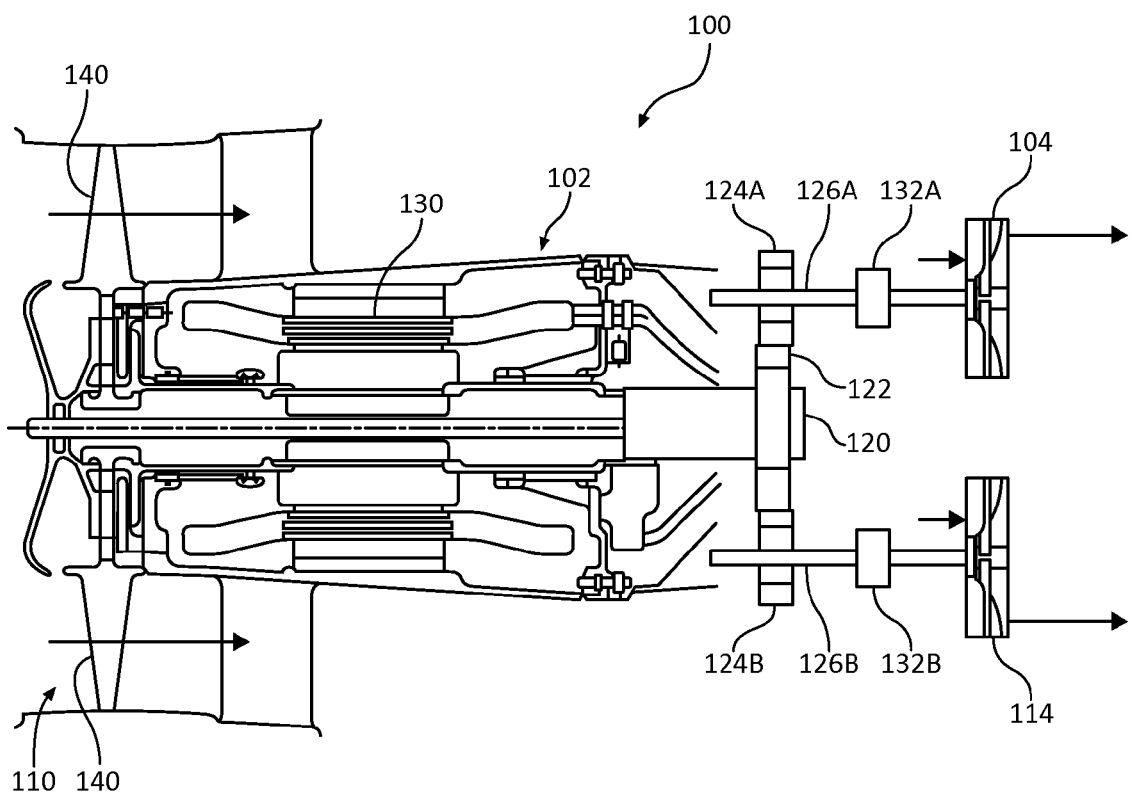
FIG. 4 illustrates, in accordance with various embodiments, a cross-sectional view of a ram air fan and power electronics cooling system.

With reference to FIG. 4, a ram air fan 102 may be mechanically coupled to both first cooling pump 104 and second cooling pump 114. In such configurations, rotating of ram air fan 102 is mechanically translated to pumping in both first cooling pump 104 and second cooling pump 114.

In various embodiments, ram air fan 102 comprises one or more blades 140 located in or near air inlet 110. As blades 140 are rotated, air is drawn in through air inlet 110 and through ram air fan 102. In various embodiments, blades 140 are mechanically coupled to ram air fan motor 130 via an output shaft 120. Rotation of blades 140 may cause output shaft 120 and ram air fan motor 130 to rotate and vice versa. For example, electrical energy may be applied to ram air fan motor 130 which causes output shaft 120 and blades 140 to rotate. In other situations, such as during flight, airflow may cause blades 140 to rotate output shaft 120 and ram air fan motor 130.

In various embodiments, output shaft 120 may be mechanically coupled to a gear 122. For example, gear 122 may be permanently coupled to output shaft 120 such as, for example, by welding. In further embodiments, gear 122 may be removably coupled to output shaft 120 such as, for example, by press fit, threading, or a keyed fit. Any manner of coupling output shaft 120 and gear 122 is within the scope of the present disclosure.

Cooling system 100 may further comprise a first cooling pump gear 124a configured to engage with gear 122. For example, as output shaft 120 rotates, gear 122 transfers rotation to first cooling pump gear 124a. In various embodiments, first cooling pump gear 124a may be mechanically coupled to a first cooling pump shaft 126a. First cooling pump shaft 126a may be configured to transfer rotation of output shaft 120 to a first cooling pump 104.

In various embodiments, first cooling pump shaft 126a also comprises a first clutch 132a. First clutch 132a may prevent first cooling pump 104 from rotating at a speed above a predetermined speed. For example, while the aircraft is in flight, blades 140 may cause output shaft 120 to rotate at a higher speed than a predetermined speed, causing first cooling pump 104 to rotate at a higher rate of speed than the predetermined speed. In such conditions, first clutch 132a may limit the rotation of first cooling pump 104 to at or below the predetermined speed.

Cooling system 100 may further comprise, for example, a second cooling pump gear 124b and a second cooling pump shaft 126b. Similarly to first cooling pump gear 124a and first cooling pump shaft 126a, second cooling pump gear 124b and second cooling pump shaft 126b are mechanically coupled and configured to transfer rotation from output shaft 120 to a second cooling pump 114.

In various embodiments, second cooling pump shaft 126b also comprises a second clutch 132b. Similarly to first clutch 132a, second clutch 132b may prevent second cooling pump 114 from rotating at a speed above a predetermined speed.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power electronics cooling system comprising:
a ram air fan comprising an air inlet and a blade mechanically coupled to a motor; and
a first pump motor coupled to a first cooling pump, wherein the first pump motor is electronically coupled to the motor of the ram air fan,
wherein the first cooling pump pumps a first cooling liquid through a heat exchanger, wherein the blade forces air through the heat exchanger, wherein the first cooling liquid is pumped through the heat exchanger and to a first electronics package, and wherein the first electronics package comprises a first motor controller.

2. The power electronics cooling system of claim 1, further comprising a second electronics package comprising a second motor controller.

3. The power electronics cooling system of claim 2, further comprising a second motor coupled to a second cooling pump, wherein the second cooling pump pumps a second cooling liquid through the heat exchanger and to the second electronics package.

4. The power electronics cooling system of claim 1, wherein the ram air fan and the first pump motor are located on an aircraft and the motor of the ram air fan provides electrical energy to the first pump motor while the aircraft is in flight.

5. The power electronics cooling system of claim 1, wherein the first motor controller provides electrical energy to the motor of the ram air fan while the aircraft is on the ground.

* * * * *